(12) United States Patent
Mancini et al.

(10) Patent No.: US 8,198,705 B2
(45) Date of Patent: Jun. 12, 2012

(54) ULTRA-THIN DIE AND METHOD OF FABRICATING SAME

(75) Inventors: David P. Mancini, Fountain Hills, AZ (US); Young Sir Chung, Chandler, AZ (US); William J. Dauksher, Mesa, AZ (US); Donald F. Weston, Phoenix, AZ (US); Steven R. Young, Gilbert, AZ (US); Robert W. Baird, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 897 days.

(21) Appl. No.: 12/211,556

(22) Filed: Sep. 16, 2008

(65) Prior Publication Data

US 2009/0008748 A1    Jan. 8, 2009

Related U.S. Application Data

(63) Continuation of application No. 10/881,144, filed on Jun. 30, 2004, now Pat. No. 7,507,638.

(51) Int. Cl.
*H01L 29/06* (2006.01)

(52) U.S. Cl. .......................... 257/622; 438/68

(58) Field of Classification Search ............ 438/68, 438/113; 257/622
See application file for complete search history.

(56) References Cited

U.S. PATENT DOCUMENTS

| | | | |
|---|---|---|---|
| 599,868 A | 3/1898 | Russell | |
| 4,720,317 A | 1/1988 | Kuroda et al. | |
| 5,034,347 A * | 7/1991 | Kakihana | 438/667 |
| 5,769,269 A | 6/1998 | Peters | |
| 5,851,845 A | 12/1998 | Wood et al. | |
| 5,888,882 A | 3/1999 | Igel et al. | |
| 5,911,329 A | 6/1999 | Wark et al. | |
| 5,927,993 A | 7/1999 | Lesk et al. | |
| 5,998,868 A | 12/1999 | Pogge et al. | |
| 6,159,754 A | 12/2000 | Li et al. | |
| 6,162,702 A | 12/2000 | Morcom et al. | |
| 6,262,078 B1 | 7/2001 | Loughhead et al. | |
| 6,328,902 B1 | 12/2001 | Hantschel et al. | |
| 6,362,078 B1 | 3/2002 | Doyle et al. | |
| 6,425,971 B1 | 7/2002 | Silverbrook | |
| 6,468,889 B1 | 10/2002 | Iacoponi et al. | |
| 6,632,706 B1 | 10/2003 | Leedy | |
| 6,692,978 B2 | 2/2004 | Tandy et al. | |

(Continued)

FOREIGN PATENT DOCUMENTS

JP    2-132844    5/1990

(Continued)

OTHER PUBLICATIONS

Klink, Gerhard, et al., "Innovative Packaging Concepts for Ultrathin ICs," Semiconductor International, Oct. 1, 2003, Reed Electronics Group, <www.reed-electronics.com/semiconductor/index.asp?layout=article> 5 pages.

(Continued)

*Primary Examiner* — Thao P. Le

(57) ABSTRACT

In accordance with a specific embodiment, a method of processing a semiconductor substrate is disclosed whereby the substrate is thinned, and the dice formed on the substrate are singulated by a common process. Trench regions are formed on a backside of the substrate. An isotropic etch of the backside results in a thinning of the substrate while maintaining the depth of the trenches, thereby facilitating singulation of the die.

20 Claims, 3 Drawing Sheets

U.S. PATENT DOCUMENTS

| | | |
|---|---|---|
| 6,734,032 B2 | 5/2004 | Tandy et al. |
| 6,765,279 B2 | 7/2004 | Leedy |
| 6,818,532 B2 | 11/2004 | Yeom et al. |
| 7,037,755 B2 | 5/2006 | Enquist |
| 7,138,295 B2 | 11/2006 | Leedy |
| 2002/0013061 A1 | 1/2002 | Siniaguine et al. |
| 2002/0016013 A1 | 2/2002 | Iketani |
| 2002/0020862 A1 | 2/2002 | Livengood et al. |
| 2003/0160315 A1 | 8/2003 | Kovar et al. |
| 2004/0072388 A1 | 4/2004 | Sekiya |
| 2004/0256726 A1 | 12/2004 | Harada et al. |

FOREIGN PATENT DOCUMENTS

| | | |
|---|---|---|
| JP | 8-264490 | 10/1996 |
| JP | 2626033 | 4/1997 |
| JP | 10-27769 | 1/1998 |
| JP | 2002-093752 | 3/2002 |
| JP | 2004-172365 | 6/2004 |
| JP | 200225948 A | 1/2005 |
| WO | 9009093 | 8/1990 |
| WO | 9214263 | 8/1992 |

OTHER PUBLICATIONS

Overview of DBG Process, Motorola Labs, no date, 1 page.

Overview of Tru-Si Process, Motorola Labs, no date, 1 pages.

PCT/US05/17703 International Search Report, Jan. 11, 2006, 2 pages.

* cited by examiner

ULTRA-THIN DIE AND METHOD OF FABRICATING SAME

CROSS-REFERENCE TO RELATED APPLICATION

The present application is a continuation of U.S. patent application Ser. No. 10/881,144, entitled "Ultra-Thin Die and Method of Fabricating Same," filed on Jun. 30, 2004, which is hereby incorporated herein by reference in its entirety.

BACKGROUND

1. Field of the Disclosure

The present disclosure relates to semiconductor devices and more particularly to methods related to reducing the thickness of semiconductor devices.

2. Description of the Related Art

Empirical studies and computer models have demonstrated that the performance of a semiconductor device can be improved by thinning the semiconductor die. The method used most commonly to thin the die is a back grinding procedure done prior to die sawing or singulation. However, grinding alone can accommodate die thinning only so much before the mechanical forces involved chip or break semiconductor wafers. In addition, subsequent to the back-grind process, the individual die formed on the wafer are singulated using a saw cutting or scribing technique. During the separate process of singulating the die, there is a likelihood of causing further damage to the die, especially when they are in a thinned state. Therefore, a method of overcoming this problem would be useful.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

In accordance with a specific embodiment of the present disclosure, a method of processing a semiconductor substrate is disclosed whereby the substrate is both thinned and diced (singulated) during a common process. In one embodiment, a mask layer, such as a photoresist or other patternable organic layer having open trench regions, is formed on the backside of the substrate using standard lithography coupled with backside alignment techniques. The trench regions are typically aligned to scribe grid regions defined on the frontside of the substrate. An anisotropic etch applied to the backside results in a pattern transfer of the trench regions onto the backside of the substrate. After the mask layer is removed, either by etch consumption or stripping, etch of the backside of the substrate is performed to thin the wafer evenly over the backside surface. The trench areas, which constitute the deepest portion of the backside are etched simultaneously and remain the deepest portion of the backside throughout. Thinning of the substrate by etching continues until the trench regions break through to the frontside at which time the wafer is singulated into individual die. The trench depth at the time the mask layer is depleted or removed, i.e., at the onset of the bulk wafer etch, determines the maximum thickness of the final die. A specific embodiment of the present disclosure will be better understood with reference to FIGS. 1-12.

Figure 1:
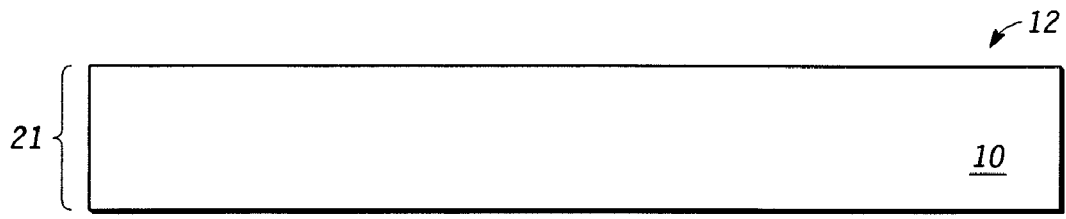
FIGS. 1-11 illustrate in cross-sectional view various steps involved in the thinning of a semiconductor substrate in accordance with the present disclosure.

FIG. 1 illustrates a cross sectional view of a workpiece 31 that includes a semiconductor substrate 10 and has two parallel major surfaces 12 and 14 and a minor surface forming an edge between the two major surfaces 12 and 14. The minor surface, or edge, forms the circumference of workpiece 31. For purposes of reference, the major surface 14 is also be referred to as the front, frontside, or active surface 14 to indicate that this is the surface having active regions forming operational devices. The major surface 12 is also referred to as the back, or backside of the substrate 12, in reference to its location relative to the front active surface 14. Reference numeral 21 represents a thickness workpiece 31. In one embodiment, the thickness 21 represents substantially the same thickness as substrate 10 during processing of the active surface 14 to form operational devices. An exemplary thickness of substrate 10 is approximately 26 mils (660.4 microns), though any workpiece thickness needing to be thinned can be used.

The substrate 10 is typically a silicon or gallium arsenide wafer, but can also be a germanium doped layer, epitaxial silicon, a silicon-on-insulator (SOI) substrate, or any like substrate suitable for formation of a semiconductor device.

Figure 2:
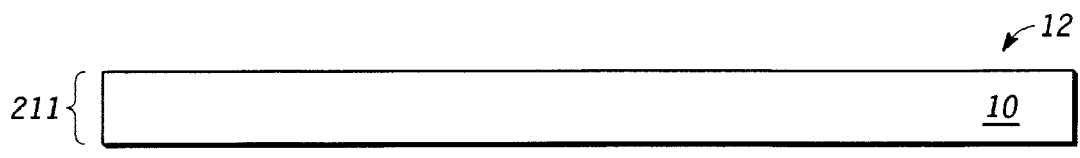

FIG. 2 illustrates the substrate 10 after being thinned to form workpiece 32 having a thickness 211. In a specific embodiment, an abrasive mechanical backgrind process has thinned the substrate 10, by applying one or more abrasives to the backside of the substrate 10 to obtain a desired intermediate thickness 211. The thickness 211 of substrate 10 is constrained by the limits of the mechanical strength of the thinned substrate material, which makes the substrate more susceptible to fracture by the continued mechanical thinning process. Typically, the thickness 211 will be in the range of 4-10 mils, however, the thickness 211 can represent a substrate of any thickness needing additional thinning. For example, the subsequent processing described in FIGS. 3-10 can be performed on thicker or thinner substrates.

Figure 3:
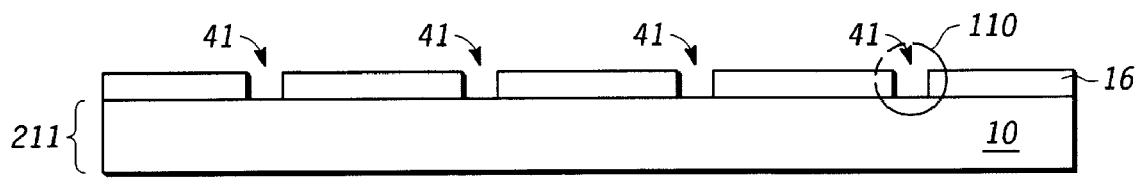

FIG. 3 illustrates a workpiece 33 having mask layer 16 formed overlying the backside of the substrate 10 of workpiece 32. Mask layer 16 may be formed of an irradiation sensitive material or a non-irradiation sensitive material, and may include multiple layers. Formation of trench regions 41 in the mask layer 16 is facilitated through the use of a patterning mask (not shown), i.e., photo-mask, or direct irradiation technique, i.e., e-beam, or laser using backside alignment techniques, well known in the art of lithography, to align the location of the trench regions 41 to the frontside of the workpiece, so that the trench regions 41 are formed on the directly overlying scribe regions.

In one embodiment, mask layer 16 is formed of a photoresist material having a thickness typically in the range of 0.25 to 25 micron, with other thickness ranges of 1-2 microns, 1-4 microns, 0.75-1.25 microns, 0.5-1.5 microns, and 0.5-3 microns, and a typical thickness of approximately 1 micron. When mask layer 16 is a photoresist layer, trenches 41 are formed into the photoresist material through the use of photolithography techniques. In another embodiment, mask layer 16 is formed of a hard-mask material, i.e., non-irradiation sensitive material, and is etched using a separate masking layer (not shown), such as a photoresist layer to define the location of trench regions 41 during an etch of the mask layer 16. The hard mask material may be any material which provides etch resistance. Hard mask materials can include organic materials, silicon oxides, silicon nitrides, silicon carbides, or metals such as aluminum, tungsten, titanium, or combinations thereof.

Figure 12:
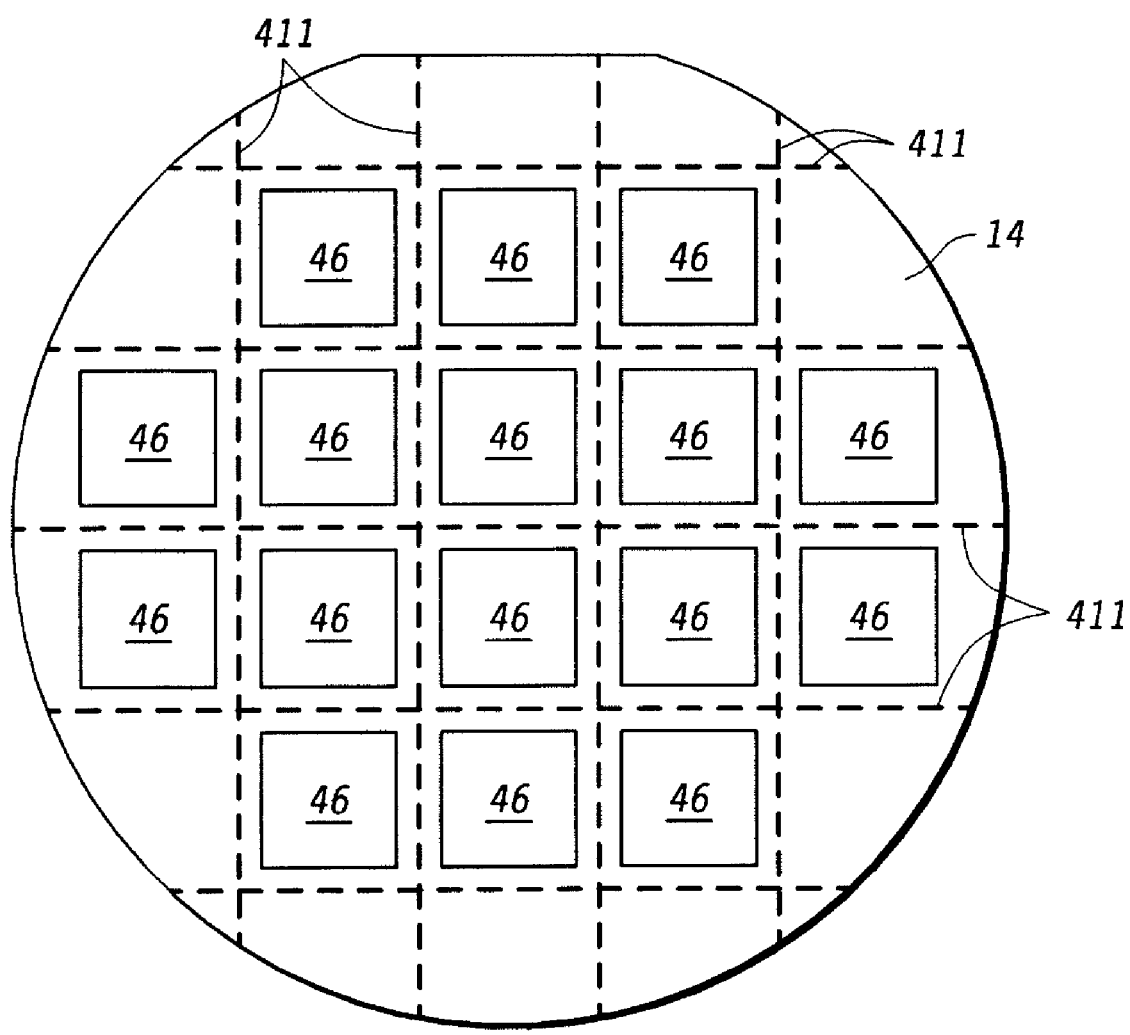
FIG. 12 illustrates the location of trench regions on a substrate in accordance with a specific embodiment of the disclosure.

FIG. 12 illustrates a plan view of a substrate having grid locations 411 representative of the locations where scribe grids are located on the active surface 14. These scribe regions are formed between devices 46 and are where cuts or scribes are typically made to singulate the die from each other. A scribe region width will typically be approximately 20-100 microns, thereby facilitating trench 41 widths of somewhat less than that range, based on alignment accuracy. It will be appreciated that in accordance with specific embodiments of the present disclosure, that the devices 46 may be of a shape other than rectangular such as round, or a device with rounded edges, and that the scribe lines may be of any pattern desired, and may or may not form uninterrupted channels across the substrate surface.

Figure 4:
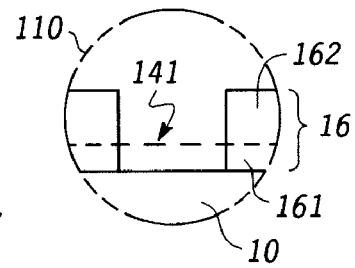

An enlarged view of a portion 110 of the workpiece 33 (FIG. 3) is illustrated in FIG. 4. The enlarged view of FIG. 4 illustrates that the trench regions 41 can be etched entirely through the mask layer 16 to expose a portion of substrate 10, or the trenches 41 can be formed partially through the mask layer 16, such as to the location illustrated by the dashed line 141. A trench formed partially through the mask layer 16 to location 141 can be obtained using a variety of techniques. For example, a timed etch would typically be used when the mask 16 is formed of a single material type, (i.e., regions 161 and 162 are of the same hard mask material). An etch selected to stop on an underlying layer 161 can be used when a multi-layer mask is used, i.e., layer 161 underlying layer 162 is formed of a different material. An etch controlled by detection of an endpoint can also be used, such as when layer 161 represents a detectable layer formed at a depth representing the desired trench depth 141. It will be appreciated that end point detection can be performed using optical spectrometry or other standard or proprietary detection techniques.

Figure 5:
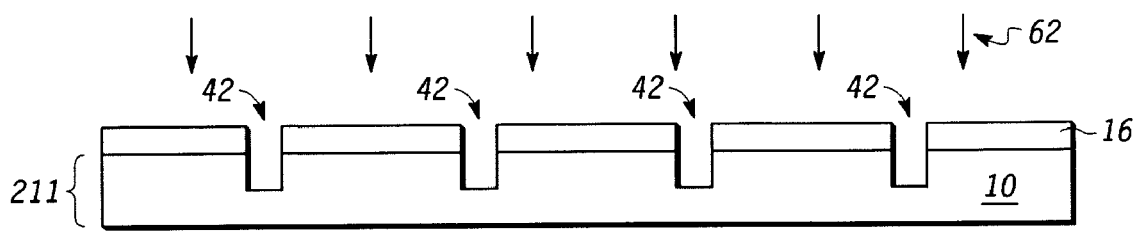

FIG. 5 illustrates trenches 42 formed within the mask layer 16 and the backside of substrate 10 by etch process 62 to form workpiece 34. In one embodiment, the etch 62 is substantially selective to the mask layer 16, so that substrate 10 is etched at a greater rate than mask layer 16. For example, when the mask layer 16 is of a photoresist material, the substrate 10 can be etched preferentially to the mask layer 16 using a process known as Bosch or deep silicon etching. As a result of this etch process, the trench formed at FIG. 3 is transferred into the substrate as shown in FIG. 5. Subsequent to formation of trench regions 42 having a desired depth in the substrate 10, the mask layer 16 can be removed during the course of etch process 63 of FIG. 6, which forms workpiece 35 having trench regions 43 formed in the substrate 10 without the hard mask 16. For example, when the mask layer 16 is a photoresist material, an etch process using an oxygen plasma or an etch that facilitates stripping or ashing of the photoresist can be used to remove photoresist mask layer once the trench regions to the substrate 10 reach a desired depth.

Figure 6:
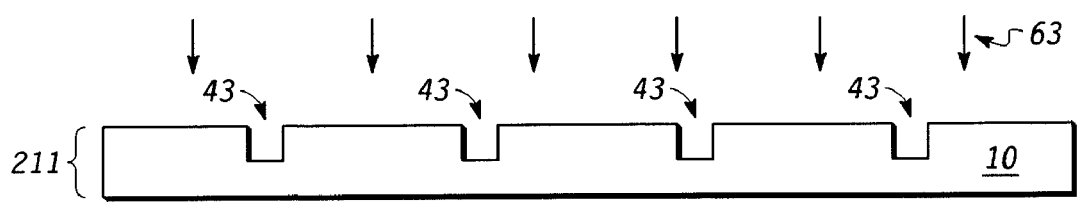

In an alternate embodiment, the trench regions 43 of workpiece 35 are formed simultaneously during an etch that consumes the mask layer 16. For example, etch 62 (FIG. 5) forms an intermediate workpiece 34 where the mask layer 16 has been partially consumed and the trench regions 43 have only been partially formed; and etch 63, of FIG. 6, represents a continuation of the etch 62, and illustrates workpiece 35 at a time where the mask layer 16 has been completely consumed, i.e., removed, by the etch process 63 and the trench regions 43 have been completely formed. In one embodiment, a thickness of mask layer 16 is such to allow for simultaneous formation of the trench region 43 in the substrate and complete consumption of the mask layer using a deep etch process, such as a Bosch etch.

A typical Bosch etch process is predicated on iterative deposition (with e.g., $C_4H_8$) and etch (e.g., $SF_6/O_2$) sequences. In general, deposition of a polymer is performed on a feature being etched. An applied substrate bias is used to facilitate polymer removal at the bottom of trenches as opposed to along the sidewalls. An etch step is then performed long enough to etch the trench deeper without punching through the protective sidewall polymer. The deposition and etch steps are repeated until the requisite depth is reached.

In a Bosch process, the low substrate bias is used to enhance the anisotropic etch characteristic. The plasma is high density, resulting in high etch rates and, potentially high selectivities. The pumping package is configured to allow for low pressures with very high gas flows.

The result of a Bosch etch can be horizontal (major) surfaces having a roughness that is atomically smooth, i.e., a surface roughness of less than 5 nm, and vertical (minor) surfaces having roughness of a scalloping nature of approximately 50 nm.

In an embodiment where the mask layer 16 is a photoresist removed by simultaneous consumption during formation of the trenches 43, the minimum thickness of the mask layer 16 is determined by the equation below. The known variables include the rate of substrate 10 removal, the rate of photoresist removal, and a desired die thickness. The desired die thickness can be obtained by forming trenches 41 through the photoresist mask layer 16 having a minimum thickness, defined by the following equation, and over etching subsequent to singulation as needed.

Minimum Mask Thickness=Desired Die Thickness*(Etch_Rate(Mask)/Etch_Rate(Substrate)).

As the etch proceeds to a conclusion by stopping at the breakthrough to the front active side, the original mask thickness defines the die thickness at the time of singulation.

Figure 7:
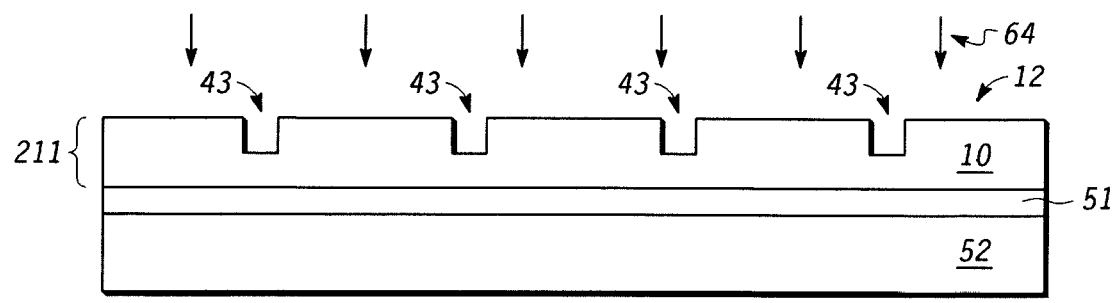

FIG. 7 is a workpiece 36 that illustrates the workpiece 35 after being attached to a handling substrate 52 through the use of an intermediate glue layer 51. The handling substrate 52 is used to support the individual die in place since the disclosed process will singulate them. It will be appreciated that the handling substrate 52 can be attached to the substrate 10 at any time prior to the substrate 10 being thinned to a point beyond which the substrate 10 cannot be effectively handled without damage, that permits alignment to the frontside. For example, the handling substrate can be added after the processes of FIG. 3.

Figure 8:
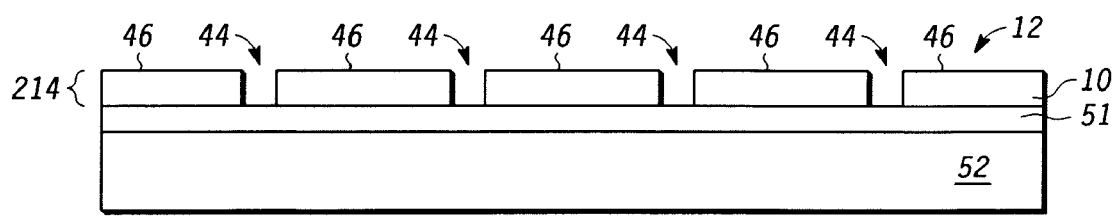

FIG. 7 also illustrates an etch 64 that continues to thin the wafer in a uniform manner. Etch 64 is any etch that etches the upper surface of the backside and the bottom of the trench regions 43 at substantially the same rate or in a known manner, thereby maintaining a substantially known depth of trench regions 43 relative to the upper surface of the backside 12. The thickness 211 represents a thickness of the substrate 10 during the thinning process. In a specific embodiment, the etch 64 is a deep silicon etch, such as the Bosch etch described herein. Etching continues until the desired die thickness 214 is obtained and the individual die 46 have been singulated, as illustrated in FIG. 8 to form workpiece 37. In a specific embodiment, the desired die thickness is less than 65 microns. In another embodiment the thickness is less than 51 microns. In yet another embodiment, the desired die thickness is less than 40 microns. Typically, the thickness of an ultra-thin die is chosen to accommodate subsequent handling and power dissipation requirements. By etching as indicated in FIG. 7, the die locations on substrate 10 are thinned, while the sidewalls of die are being exposed inside the trench, until the entire sidewall of the die is exposed, see FIG. 8.

It will be appreciated that the final die thickness 214 can be precisely controlled to a predetermined amount based on a starting depth of trench regions 43 (FIG. 6). FIG. 6 illustrates the workpiece at the time mask layer 16 is completely consumed, either by etch consumption during formation of the trench regions 43 or by stripping. Continued etching subsequent to the time represented by FIG. 6 allows for detecting when the etch breaks through to the frontside. For example, the etch can be terminated upon breakthrough by an endpoint detection where chemical elements, i.e., endpoint materials, known to be found on the scribe areas of the frontside of the wafer can be detected within a plasma of a plasma etch. For example, an endpoint layer can be formed overlying the frontside scribe regions to provide a material that is detectable by optical spectroscopy in the plasma during the backside etch. Detection of such "tagging" elements signifies that the front has been reached, or is soon to be reached, and the etch can be stopped. Alternatively, detection of a tagging element or condition can be followed by a short timed etch to assure singulation. These techniques may prevent both incomplete etching, which fails to go completely through the wafer and thus does not singulate the dice, and overetching, which removes too much material and thins the dice too much.

Figure 9:
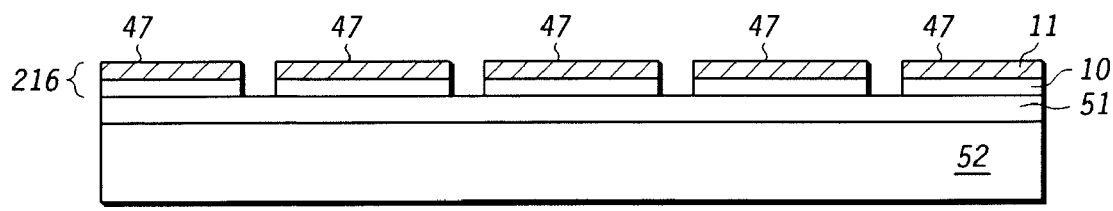

FIG. 9 illustrates a workpiece 38 that includes the formation of a back metal layer 11 over the backsides of dice 46 to form dice 47. The back-metal layer 11 facilitates subsequent attachment of the individual die 47 to packaging substrates.

Figure 10:
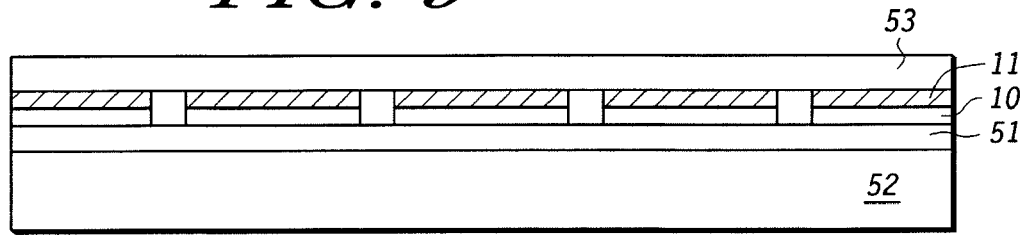
Figure 11:
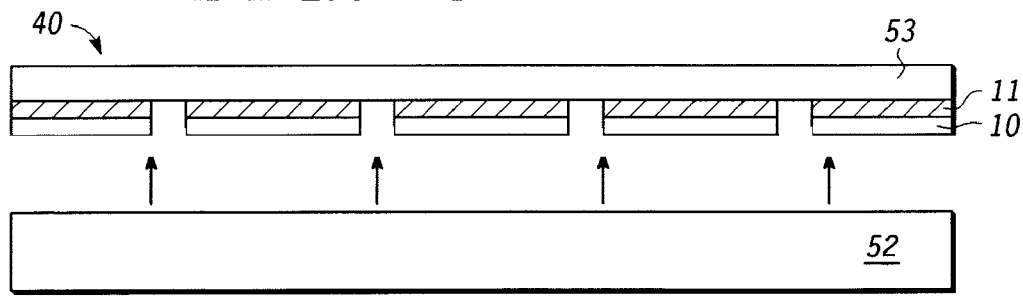

FIG. 10 illustrates pick-up tape 53 applied to the backside of workpiece 38, thereby forming workpiece 39. At FIG. 11, the glue layer 5 has been dissolved, or otherwise removed to allow detachment of the handling substrate 52 to form workpiece 40.

Subsequent to singulation, the die 47 can be packaged using conventional or proprietary packaging techniques and material. For example, the die can be packaged using flip chip techniques, wire bond techniques, or a combination thereof. The packages can be of any material type including ceramic and plastic packages, as well as ball-grid packages, wire-lead packages, or any other package type.

In the preceding detailed description of the preferred embodiments, reference has been made to the accompanying drawings, which form a part thereof, and in which is shown by way of illustration specific preferred embodiments in which the invention may be practiced. These embodiments are described in sufficient detail to enable those skilled in the art to practice the invention, and it is to be understood that other embodiments may be utilized without departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present invention is defined only by the appended claims.

What is claimed is:

1. A device comprising a semiconductor die comprising a substrate, the substrate comprising a first major surface at which a semiconductor device is formed, and a minor surface having a roughness of a scalloping nature, wherein the minor surface is perpendicular to the major surface.

2. The device of claim 1, wherein the roughness of the scalloping nature is approximately 50 nm.

3. The device of claim 2, wherein the substrate further comprises a second major surface opposite the first major surface, the second major surface having a roughness of less than 5 nm.

4. The device of claim 3, wherein the substrate comprises a semiconductor, and the second major surface has a roughness that is atomically smooth.

5. The device of claim 4, wherein the semiconductor is silicon.

6. The device of claim 3, wherein the substrate has a thickness of less than 65 microns.

7. The device of claim 3, wherein the substrate has a thickness of less than 51 microns.

8. The device of claim 3, wherein the substrate has a thickness of less than 40 microns.

9. The device of claim 3, wherein the device further comprises a metal layer overlying the second major surface of the substrate.

10. The device of claim 9, wherein the metal layer is formed subsequent to forming the minor surface of the substrate.

11. The device of claim 1, wherein the substrate comprises a bulk semiconductor substrate.

12. The device of claim 1, wherein the substrate comprises a semiconductor-on-insulator substrate.

13. The device of claim 1 further comprising a packaged device comprising the semiconductor die.

14. The device of claim 13, wherein the packaged device comprises a plastic package.

15. The device of claim 13, wherein the packaged device comprises a ceramic package.

16. The device of claim 13, wherein the packaged device comprises a ball grid array package.

17. The device of claim 1, wherein the substrate has a thickness of less than 65 microns.

18. The device of claim 17, wherein the substrate comprises a bulk semiconductor substrate.

19. The device of claim 1, wherein the substrate has a thickness of less than 51 microns.

20. The device of claim 1, wherein the substrate has a thickness of less than 40 microns.

* * * * *